(12) United States Patent
Tsai et al.

(10) Patent No.: US 7,642,191 B2
(45) Date of Patent: Jan. 5, 2010

(54) METHOD OF FORMING SEMICONDUCTOR STRUCTURE

(75) Inventors: Hung-Mine Tsai, Taipei (TW); Ching-Nan Hsiao, Taipei (TW); Chung-Lin Huang, Taipei (TW)

(73) Assignee: Nanya Technology Corp., Taiwan (CN)

( * ) Notice: Subject to any disclaimer, the term of this patent is extended or adjusted under 35 U.S.C. 154(b) by 83 days.

(21) Appl. No.: 12/019,260

(22) Filed: Jan. 24, 2008

(65) Prior Publication Data
US 2009/0053873 A1 Feb. 26, 2009

(30) Foreign Application Priority Data
Aug. 24, 2007 (TW) .............................. 96131508 A (51) Int. Cl.
*H01L 21/311* (2006.01)
(52) U.S. Cl. .................. 438/700; 438/238; 438/311; 438/381; 257/E21.17; 257/E21.218; 257/E21.229; 257/E21.245; 257/E21.548; 257/E21.324
(58) Field of Classification Search ................ 438/700, 438/238, 381, 270, 257, 552, 553, 706, 712, 438/745, 770, 680, 514, 311
See application file for complete search history.

(56) References Cited

U.S. PATENT DOCUMENTS

| | | | | |
|---|---|---|---|---|
| 5,316,978 A | * | 5/1994 | Boyd et al. | 438/382 |
| 5,352,923 A | * | 10/1994 | Boyd et al. | 257/536 |
| 5,627,395 A | * | 5/1997 | Witek et al. | 257/350 |
| 6,355,524 B1 | * | 3/2002 | Tuan et al. | 438/257 |
| 6,743,675 B2 | * | 6/2004 | Ding | 438/257 |
| 6,838,342 B1 | * | 1/2005 | Ding | 438/257 |
| 6,925,007 B2 | * | 8/2005 | Harari et al. | 365/185.15 |
| 7,355,239 B1 | * | 4/2008 | Haselden et al. | 257/314 |
| 7,381,615 B2 | * | 6/2008 | Yuan | 438/257 |

* cited by examiner

*Primary Examiner*—David Nhu
(74) *Attorney, Agent, or Firm*—Ingrassia Fisher & Lorenz, P.C.

(57) ABSTRACT

A method of forming a semiconductor structure is provided. The method includes providing a substrate and forming a mask layer on the substrate, Next, dielectric isolations are formed in the mask layer and the substrate, wherein the dielectric isolations extend above the substrate. Then, the mask layer is removed to expose a portion of the substrate, and a dielectric layer is formed on the exposed portion of the substrate. Subsequently, a first conductive layer is formed on the dielectric layer, and a portion of the dielectric isolation is removed, wherein a top surface of the remaining dielectric isolation is lower than a top surface of the first conductive layer. Moreover, a conformal layer is formed over the substrate, and a second conductive layer is formed on the conformal layer.

9 Claims, 13 Drawing Sheets

METHOD OF FORMING SEMICONDUCTOR STRUCTURE

CROSS REFERENCE TO RELATED APPLICATION

This application claims the right of priority based on Taiwan Patent Application No. 096131508 entitled "Method of Forming Semiconductor Structure," filed on Aug. 24, 2007, which is incorporated herein by reference and assigned to the assignee herein.

FIELD OF THE INVENTION

The present invention relates to a method of forming a semiconductor device, and more particularly, to a self-aligned method to define a floating gate of a memory device.

BACKGROUND OF THE INVENTION

The fabrication of semiconductor circuits generally and repeatedly performs a series of processes including lithography, deposition, etching, and the like to form layer-stacked integrated circuits. However, as the feature size of the semiconductor device shrinks, the processes become difficult to control and the precision of the process is highly demanded, so that the overlay precision of the photomasks and the alignment technology in the lithography process become more and more difficult to control.

The conventional methods of forming memory devices generally include performing the exposure and the development processes several times to independently define the active area, the floating gate pattern, and the control gate pattern, so as to adjust or increase the coupling area between the floating gate and the control gate. However, the conventional method increases the complexity of integration, and every additional photomask procedure raises the cost and increase the process time. Moreover, as described above, the alignment issue becomes more and more critical as the feature size shrinks and more photomasks are implemented.

Therefore, it is desired to provide a method of forming a semiconductor structure to reduce the required lithography steps by using a self-aligned manner to define the floating gate of the memory device.

SUMMARY OF THE INVENTION

One aspect of the present invention is to provide a method of forming a semiconductor structure, which is integrated with the current processing steps to define a floating gate without implementing additional lithography processes.

Another aspect of the present invention is to provide a method of forming a semiconductor structure with a self-aligned floating gate by using the active area and the gate contact patterning steps, so as to simplify the processing steps.

A further aspect of the present invention is to provide a method of forming a semiconductor structure to effectively modify the floating gate area to increase the coupling ratio by adjusting the size of a mask layer.

In one embodiment, the present invention provides a method of forming a semiconductor structure. The method includes providing a substrate and forming a mask layer on the substrate. Then, dielectric isolations are formed in the mask layer and the substrate and extended above the substrate. The mask layer is partially removed to expose a portion of the substrate. A dielectric layer is formed on the exposed portion of the substrate. A first conductive layer is formed on the dielectric layer. A portion of the dielectric isolations is removed so that a top surface of the remaining dielectric isolations is lower than a top surface of the first conductive layer. A conformal layer is formed over the substrate; and a second conductive layer is formed on the conformal layer.

In an exemplary embodiment, the step of forming dielectric isolations in the present invention includes: forming a plurality of parallel trenches in the mask layer and the substrate along a first direction; filling the trenches with a dielectric material to form dielectric isolations; and planarizing the dielectric isolations, so that the dielectric isolations are substantially flush with the mask layer. In addition, the step of forming the second conductive layer includes: blanket-depositing a conductive layer over the conformal layer; and removing a portion of the conductive layer, a portion of the conformal layer, and a portion of the first conductive layer along a second direction perpendicular to the first direction.

In another exemplary embodiment, the step of forming the first conductive layer includes: forming a conformal conductive layer on the substrate; forming a conductive layer over the substrate; and planarizing the conductive layer to expose the dielectric isolations, wherein the conformal conductive layer has a resistivity different from that of the conductive layer.

DETAILED DESCRIPTION OF THE INVENTION

The present invention provides a method of forming a semiconductor structure, which is integrated with the current processing steps to define a self-aligned floating gate of a memory device without implementing additional lithography processes. FIG. 1 to FIG. 6 illustrates top views and cross-sectional views in accordance with one preferred embodiment of the present invention. The layers described below can be formed by conventional techniques including lithography (such as coating, exposing, developing), etching (such as dry etching, wet etching, reactive ion etching), deposition (such as chemical vapor deposition, physical vapor deposition, plasma enhanced deposition), thermal process (such as thermal oxidation, annealing, thermal diffusion), polishing (such as chemical mechanical polishing), and implanting (such as ion implantation) and the likes, which are well known in the arts and not deliberated hereinafter. Moreover, the same or similar reference numbers will be used throughout the drawings to refer to the same or similar features, and features of the invention are not necessarily shown to scale in the drawings.

Figure 1:
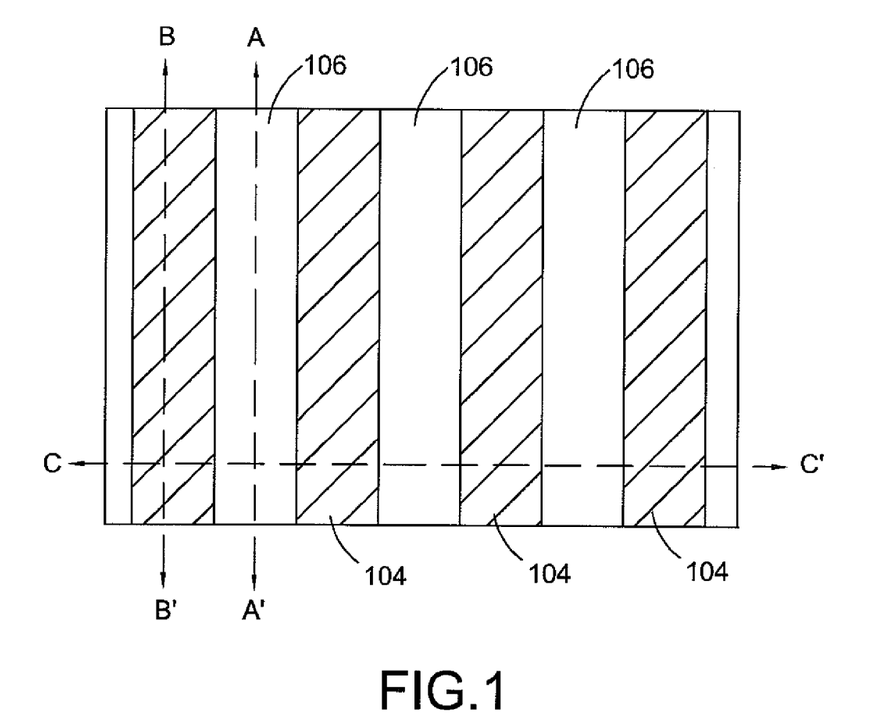
FIGS. 1, 1A, 1B and 1C are a top view and cross-sectional views taken along lines A-A', B-B' and C-C' of FIG. 1, respectively, showing the step of forming dielectric isolations in the process of forming a semiconductor structure according to one embodiment of the present invention.
Figure 1A:
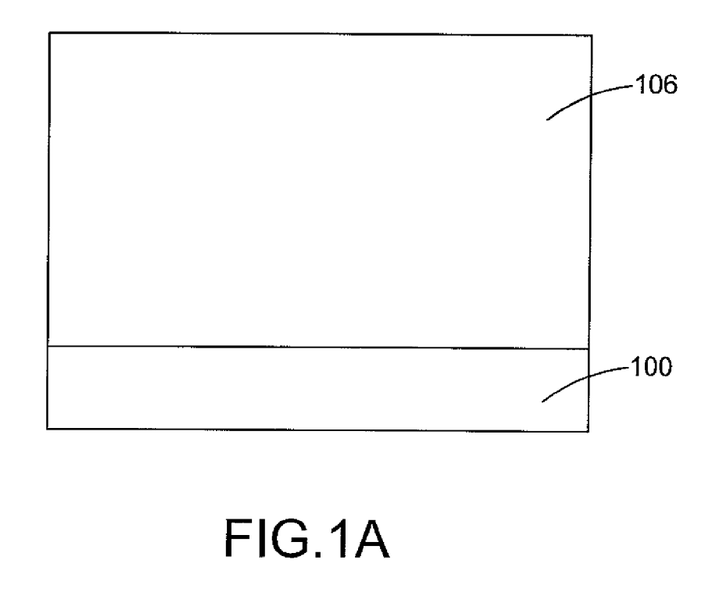
Figure 1B:
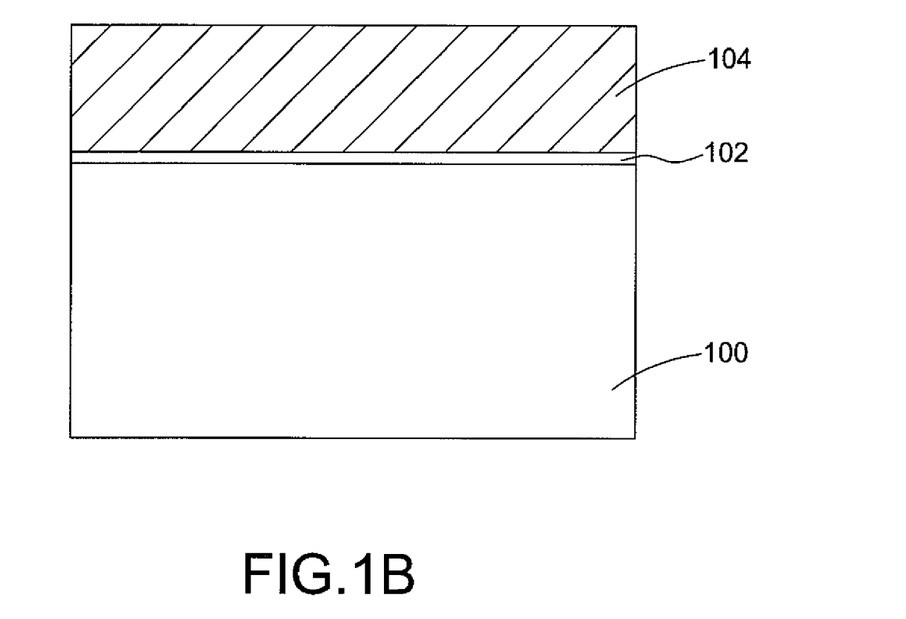

FIGS. 1, 1A, 1B, and 1C illustrate a top view and cross-sectional views taken along lines A-A', B-B', and C-C' of FIG. 1, respectively, showing the step of forming dielectric isolations in the process of forming a semiconductor structure according to one embodiment of the present invention. In one embodiment, the present invention provides a method of forming a semiconductor structure. The method includes a step of providing a substrate 100, which can be any substrate for forming a semiconductor device. The substrate 100 can be, for example, a silicon substrate, a silicon-on-insulator (SOI) substrate, a silicon germanium substrate, a silicon-germanium-on-insulator substrate (SGeOI), and the like. In this embodiment, the substrate 100 is a silicon substrate. A mask layer is then formed on the substrate 100. In general, the mask layer is used to protect the underlying layers from damage during subsequent processes. However, in this embodiment, the mask layer is also used to define the location of a floating gate in subsequent steps, which will be described in detail below. The mask layer may be a single layer or multi-layer structure including, for example, an oxide layer, a nitride layer or the combination thereof. In this embodiment, the mask layer is a dual-layered structure including, but not limited to, an oxide layer 102 and a nitride layer 104. In an exemplary embodiment, the oxide layer 102 is formed on the substrate 100 by utilizing a deposition process, and the nitride layer 104 is formed on the oxide layer 102 also by a deposition process. The thickness of the mask layer may be modified in accordance with the desired height of the floating gate. For example, the thickness of the mask layer is typically 1500 Å to 2000 Å, and preferably, is substantially the same as the height of the floating gate, but not limited thereto.

Figure 1C:
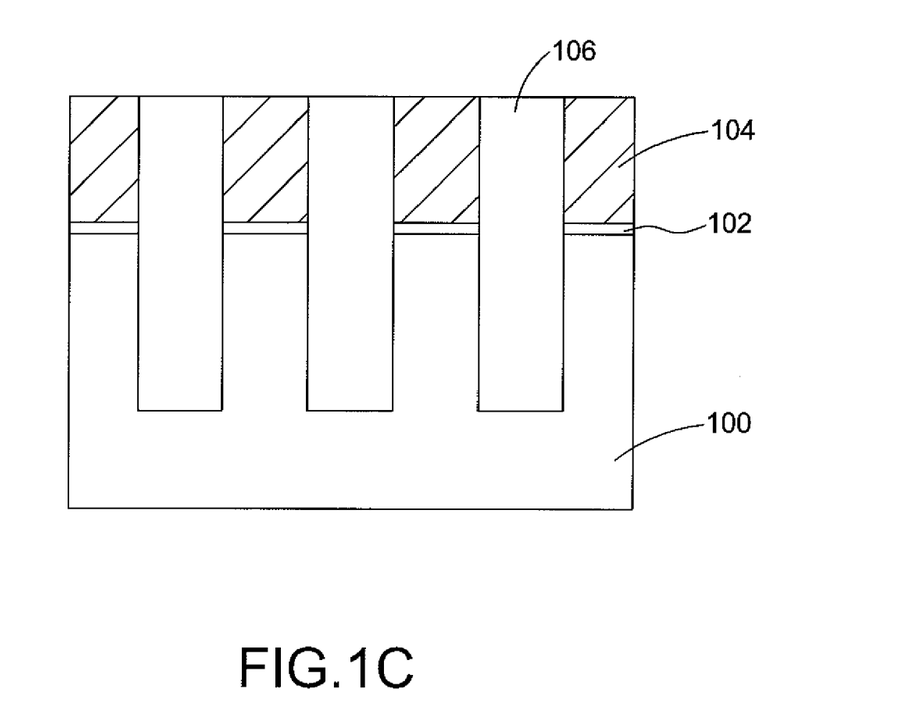

As shown in FIG. 1 and FIG. 1A to 1C, dielectric isolations 106 are formed in the substrate 100 as well as in the mask layer (102 and 104) and extended above the substrate 100. In an exemplary embodiment, the step of forming the dielectric isolations 106 includes forming a plurality of parallel trenches in the mask layer (102 and 104) and the substrate 100 along a first direction (i.e. line A-A' of the FIG. 1). The step of forming the parallel trenches includes conventional lithography and etching techniques. For example, a photoresist is first coated on the mask layer, and then exposed and developed to form a patterned photoresist. Then, by using the patterned photoresist as a mask, the mask layer 102, 104 and the substrate 100 are etched to form trenches in the mask layer 102, 104 and the substrate 100. Subsequently, the trenches are filled with a dielectric material to form the dielectric isolations 106. The trenches may be filled by blanket-depositing a dielectric material (such as an oxide) over the substrate 100. Then, the dielectric isolations 106 are planarized to expose the mask layer. Preferably, the dielectric isolations 106 are planarized so that the dielectric isolations 106 and the mask layer (i.e. the nitride layer 104) are substantially in a same plane, as shown in FIG. 1C.

Figure 2:
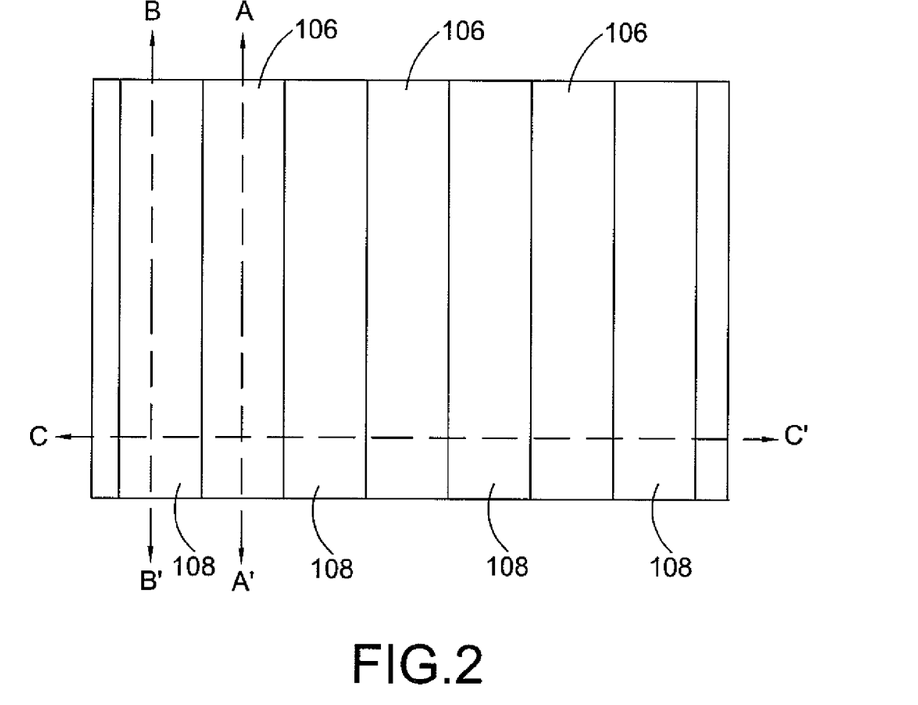
FIGS. 2, 2A, 2B and 2C are a top view and cross-sectional views taken along lines A-A', B-B' and C-C' of FIG. 2, respectively, showing the step of removing the mask layer in the process of forming a semiconductor structure according to one embodiment of the present invention.
Figure 2A:
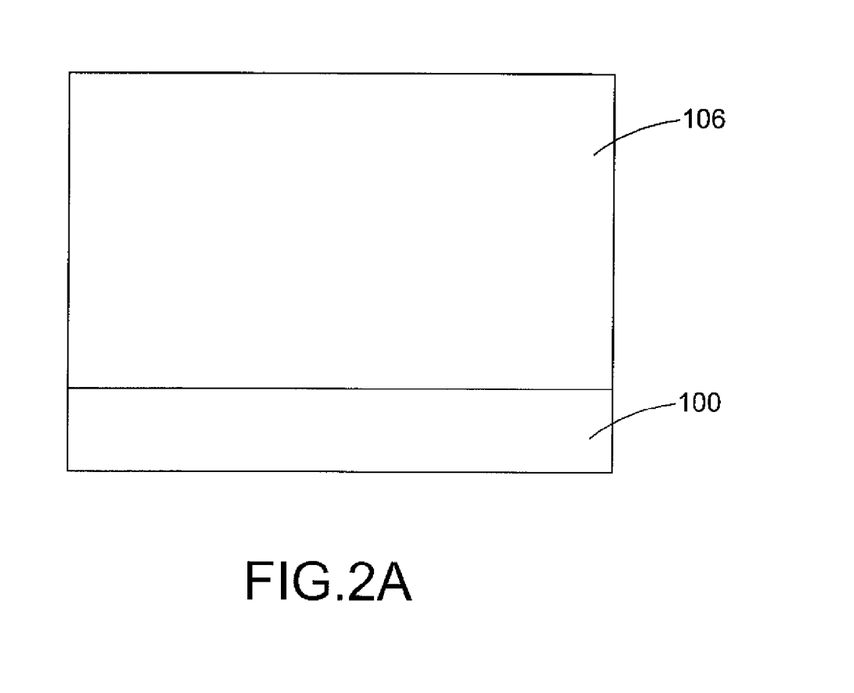
Figure 2B:
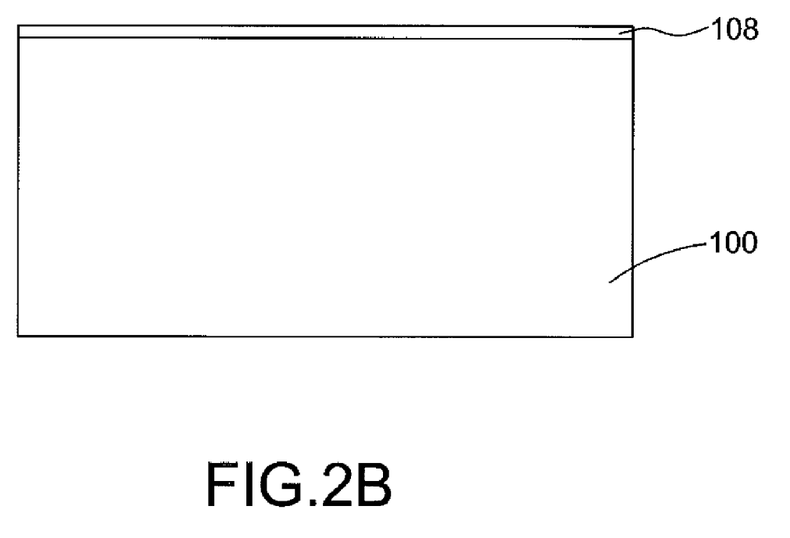
Figure 2C:
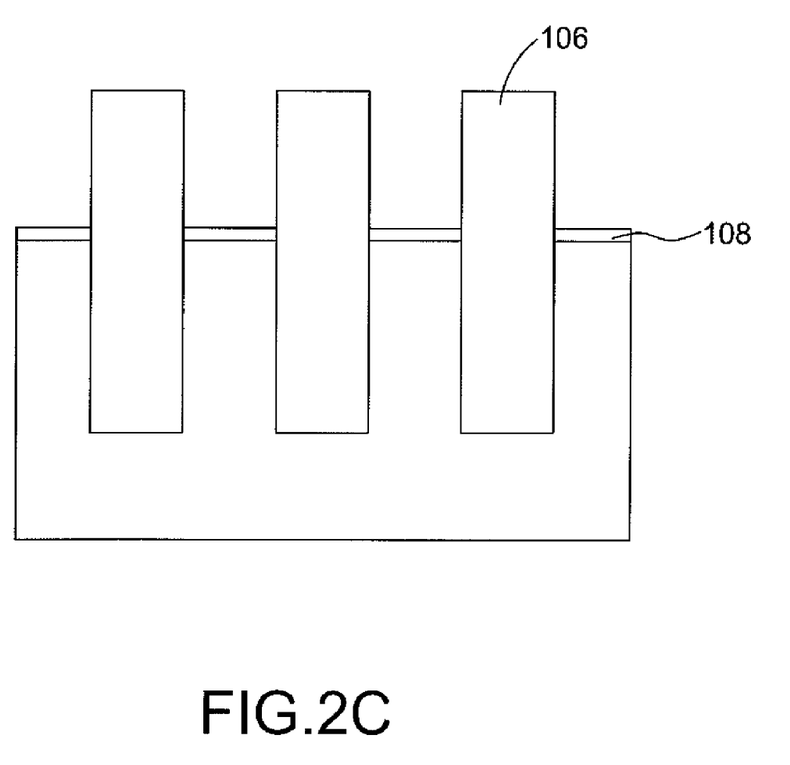

FIGS. 2, 2A, 2B and 2C illustrate a top view and cross-sectional views taken along lines A-A', B-B' and C-C' of FIG. 2, respectively, showing the step of removing the mask layer according to the embodiment of the present invention. As shown in these figures, the mask layer is removed to expose a portion of the substrate 100. For example, the nitride layer 104 and the oxide layer 102 between the dielectric isolations 106 are removed to expose the substrate 100. The steps of removing the nitride layer 104 and the oxide layer 102 can be performed by using any appropriate etching process, such as a reactive ion etching. Please note that a location where the mask layer is removed is the location where the floating gate is to be formed later. Therefore, the height of the dielectric isolations 106 extended above the substrate 100 defines the height of the floating gate. In other words, the height of the dielectric isolations 106 is defined by the mask layer, so that the size of the floating gate can be dynamically modified by adjusting the thickness of the mask layer. Next, a dielectric layer 108 is formed on the exposed portion of the substrate 100. For example, the dielectric layer 108 is formed by thermal oxidizing the substrate 100 to form the dielectric layer 108 functioning as a gate oxide layer. The dielectric layer 108 formed in the above-described step has a better dielectric characteristic, which is advantageous for serving as the gate oxide layer of the memory device.

Figure 3:
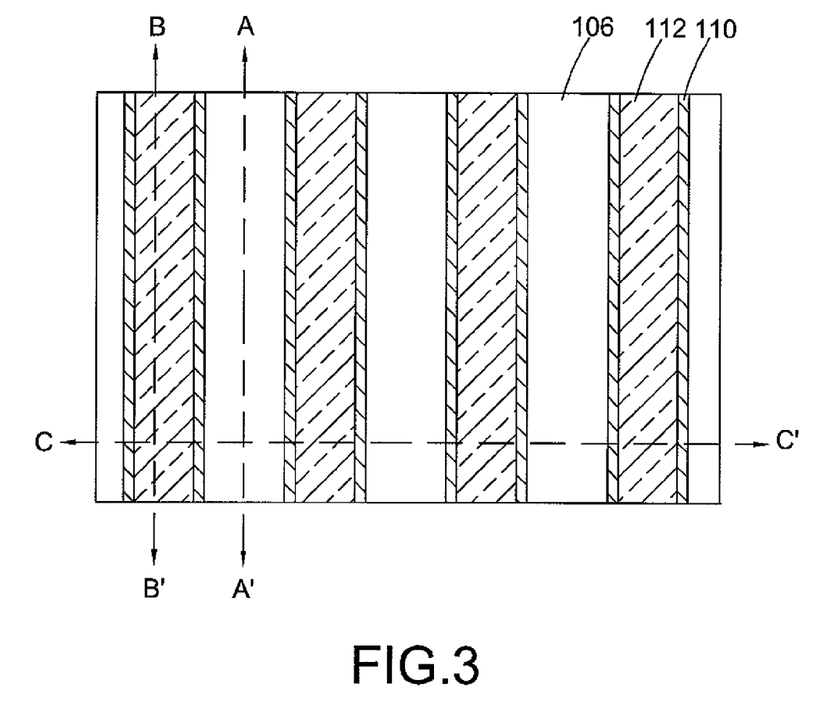
FIGS. 3, 3A, 3B and 3C are a top view and cross-sectional views taken along lines A-A', B-B' and C-C' of FIG. 3, respectively, showing the step of forming the floating gate conductor in the process of forming a semiconductor structure according to one embodiment of the present invention.
Figure 3A:
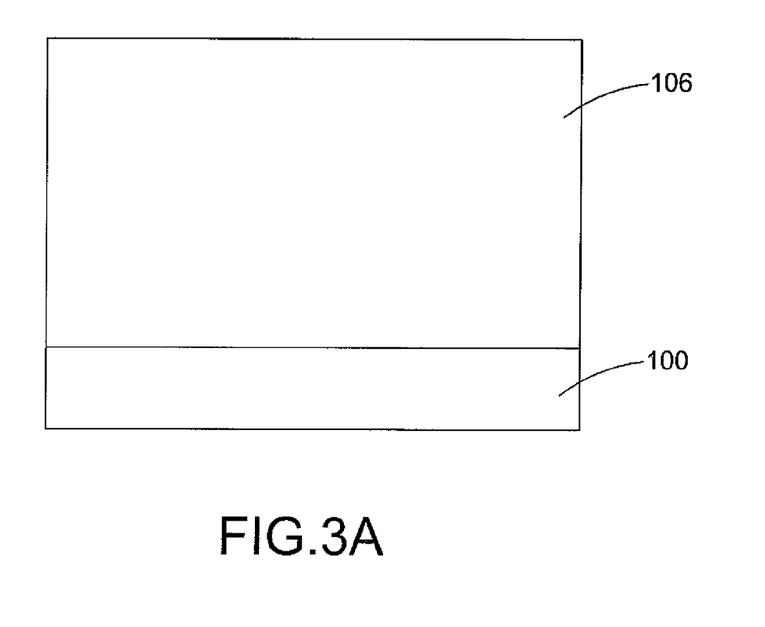
Figure 3B:
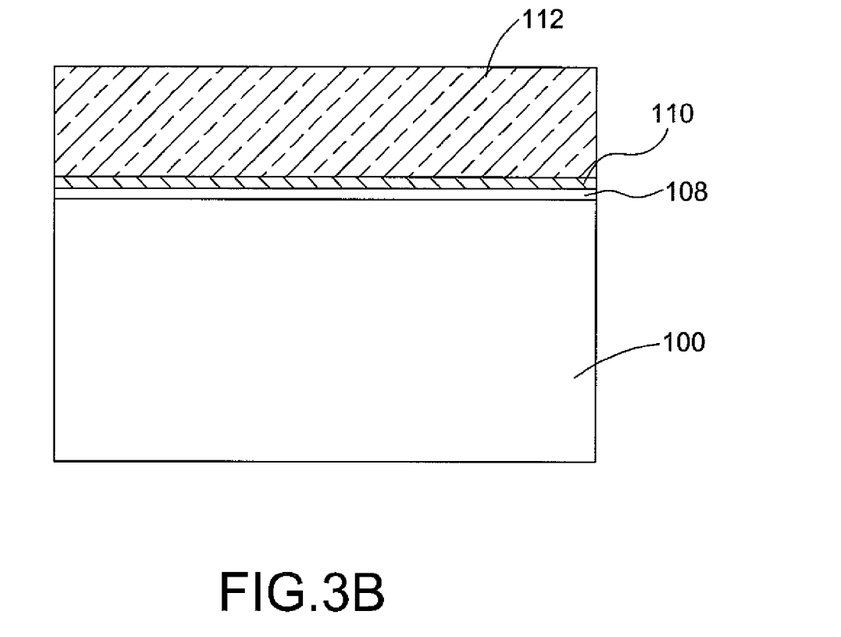
Figure 3C:
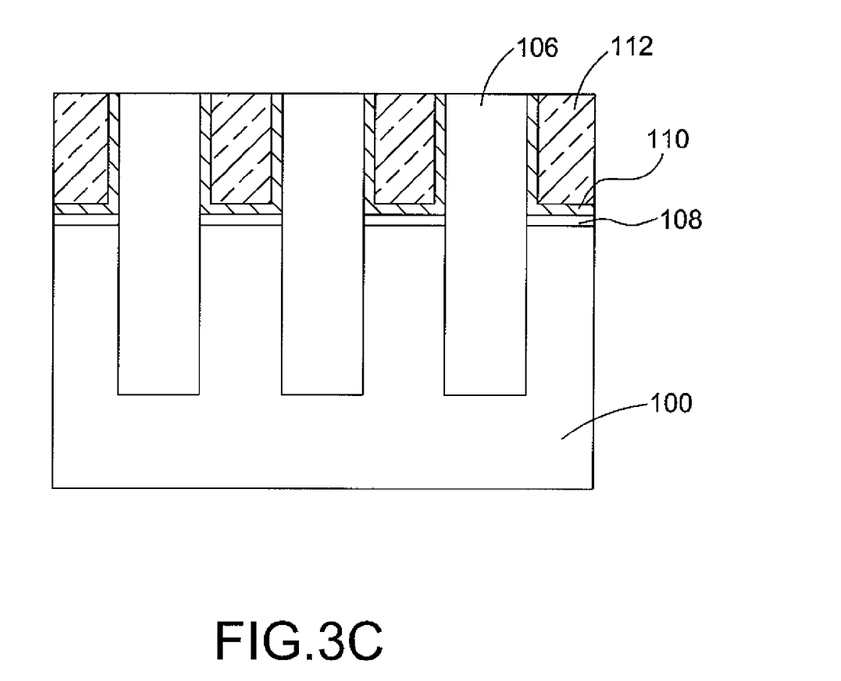

FIGS. 3, 3A, 3B and 3C are a top view and cross-sectional views taken along lines A-A', B-B' and C-C' of FIG. 3, respectively, showing the step of forming the floating gate conductor according to one embodiment of the present invention. As shown in the figures, a first conductive layer is formed on the dielectric layer 108. For example, the first conductive layer can be a single layer or multi-layer conductive structure depending on the design need. In this embodiment, the step of forming the first conductive layer includes forming a conformal conductive layer 110 on the substrate 1 00. That is, the conformal conductive layer 110 is formed on the substrate 100 and the sidewall and the top of the exposed dielectric isolations 106. A conductive layer 112 is then formed over the substrate 100. The conductive layer 112 and the conformal conductive layer 110 are planarized to expose the top of the dielectric isolations 106. It is noted that the first conductive layer functions as the floating gate of the memory device, and the conformal conductive layer 110 preferably has a resistivity different from that of the conductive layer 112. For example, the conformal conductive layer 110 may be an undoped polysilicon layer, and the conductive layer 112 may be an in-situ doped polysilicon layer.

Figure 4:
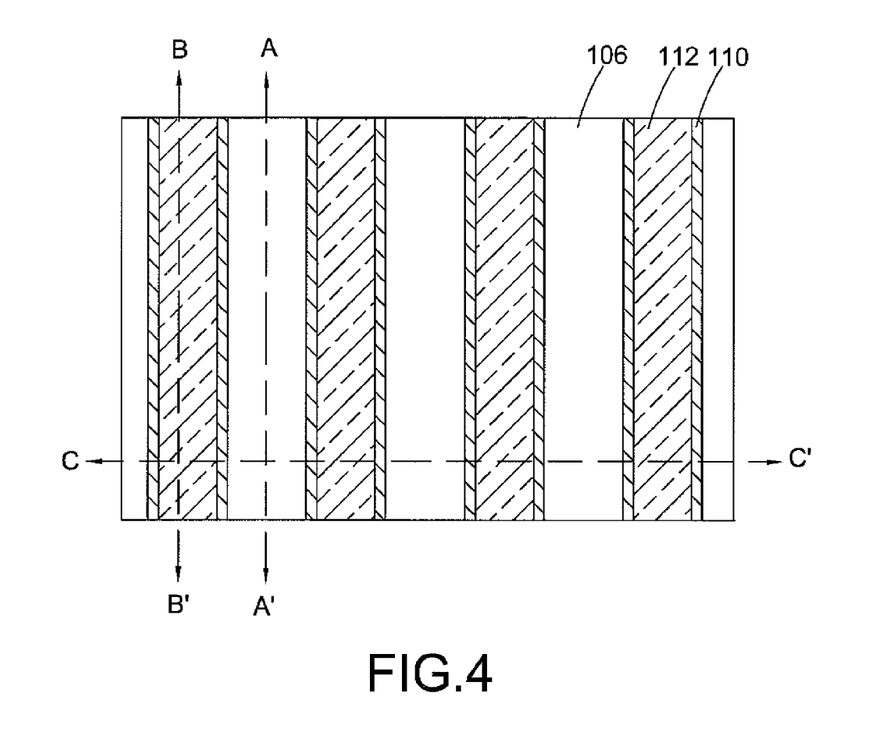
FIGS. 4, 4A, 4B and 4C are a top view and cross-sectional views taken along lines A-A', B-B' and C-C' of FIG. 4, respectively, showing the step of removing a portion of the dielectric isolations in the process of forming a semiconductor structure according to one embodiment of the present invention.
Figure 4A:
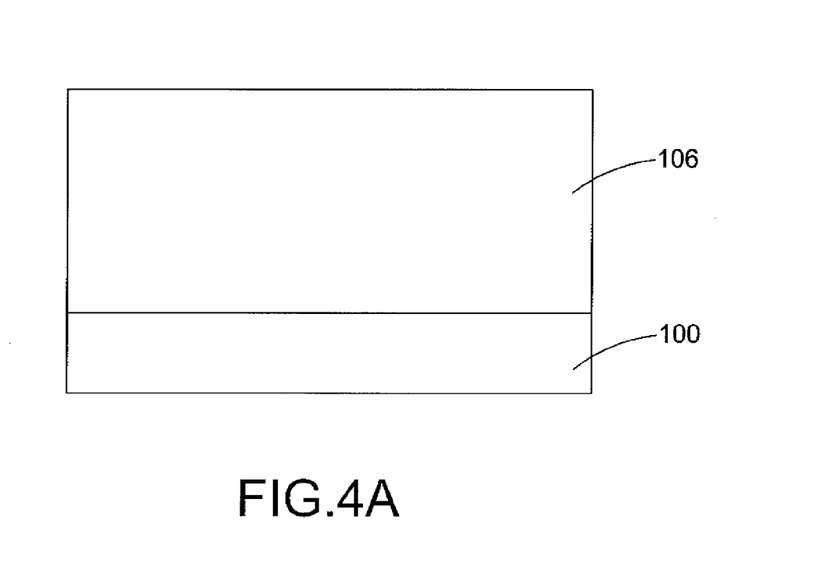
Figure 4B:
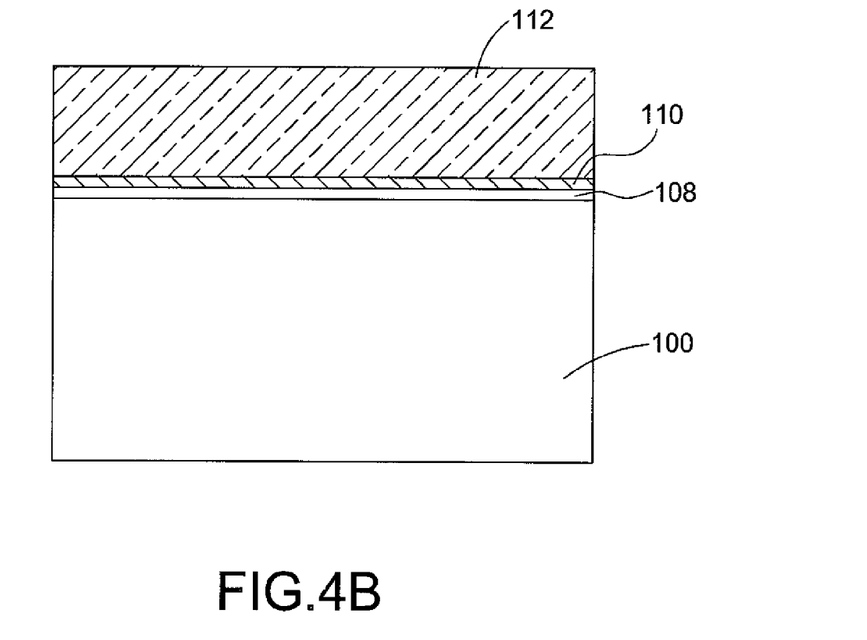
Figure 4C:
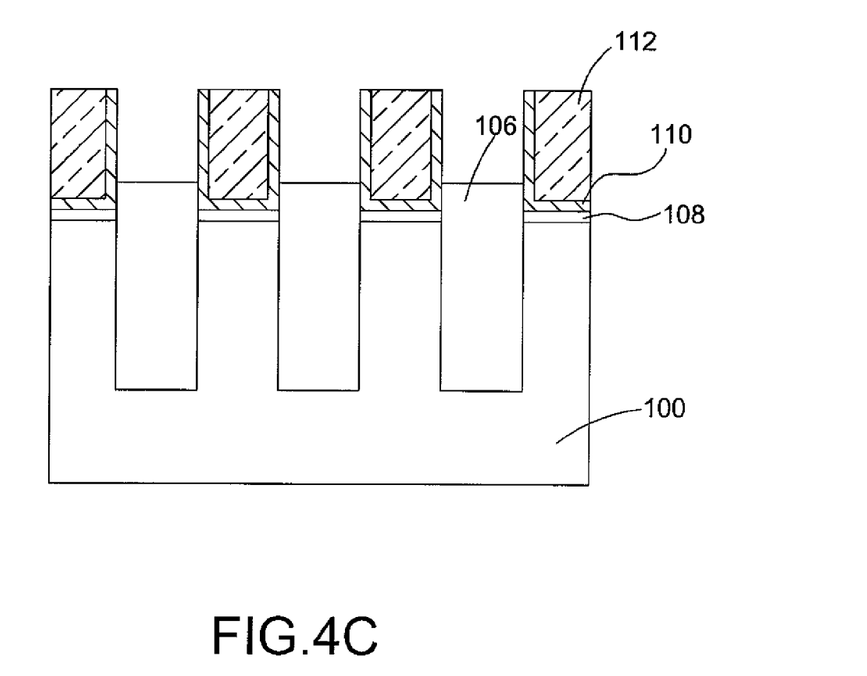
Figure 5:
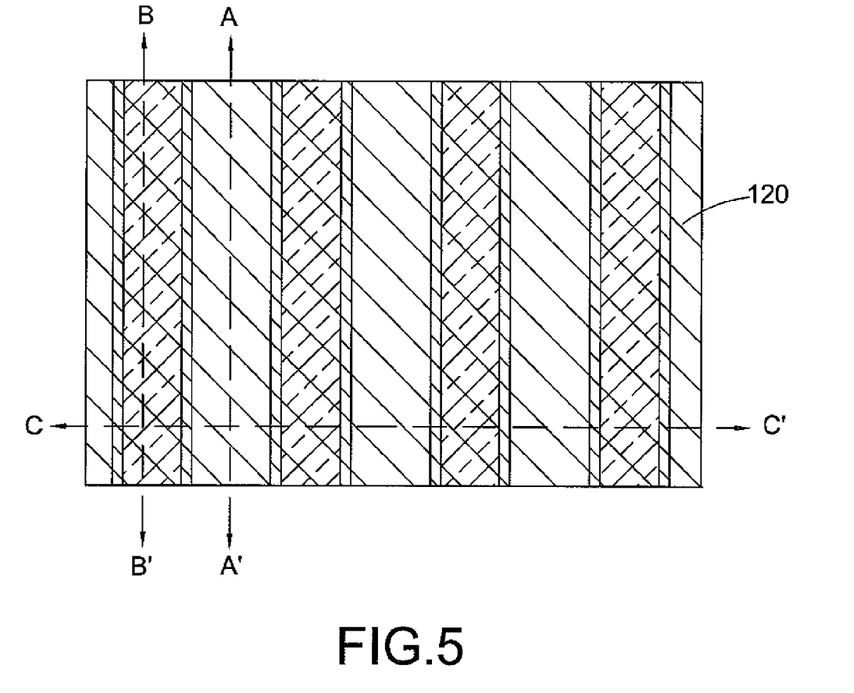
FIGS. 5, 5A, 5B and 5C are a top view and cross-sectional views taken along lines A-A', B-B' and C-C' of FIG. 5, respectively, showing the step of forming the control gate conductor in the process of forming a semiconductor structure according to one embodiment of the present invention.
Figure 5A:
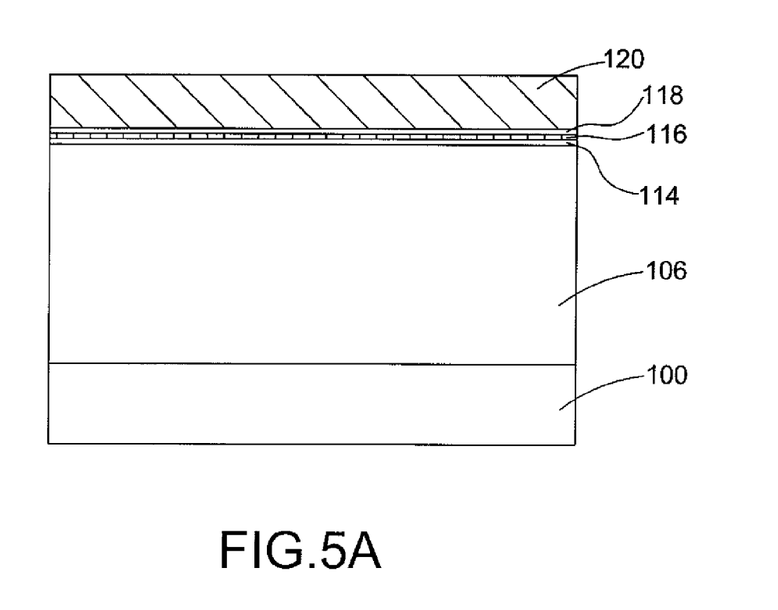
Figure 5B:
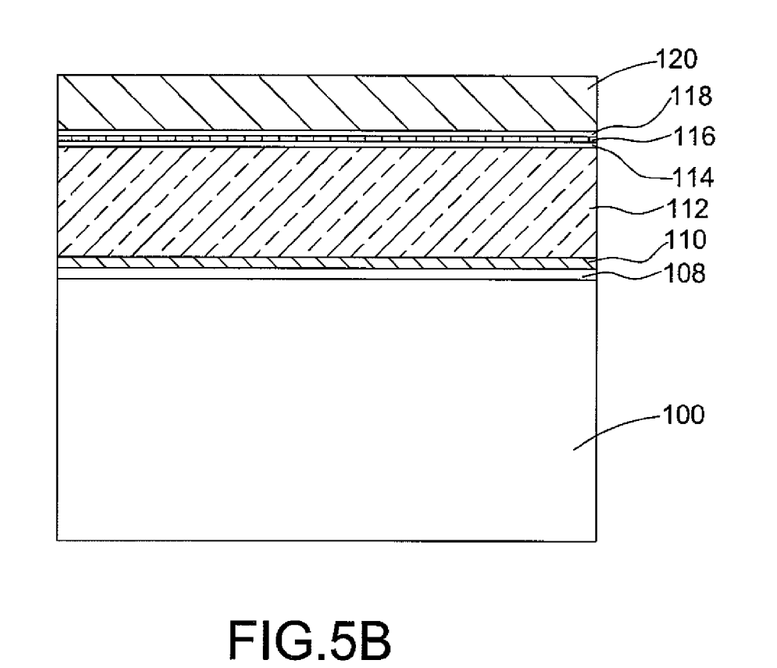
Figure 5C:
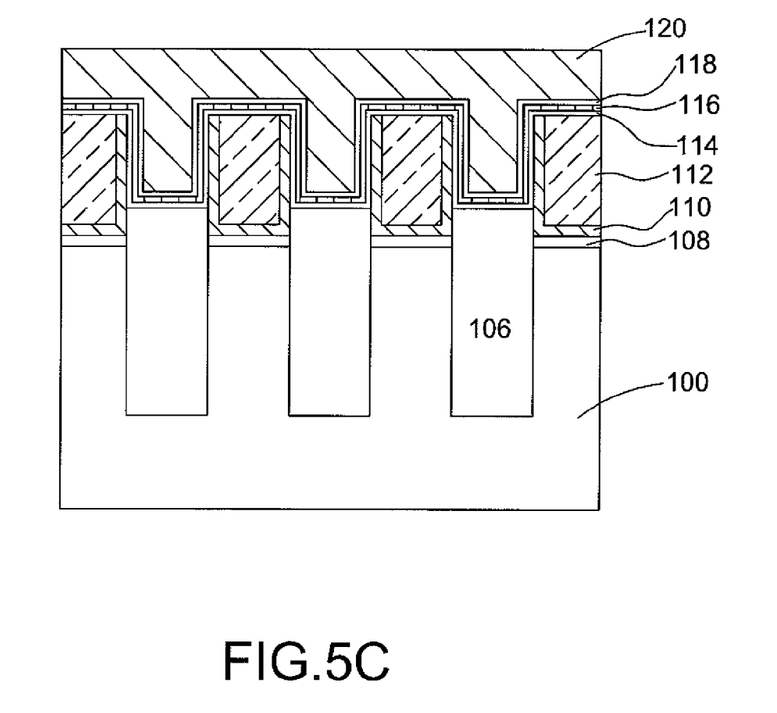

FIGS. 4, 4A, 4B and 4C are a top view and cross-sectional views taken along lines A-A', B-B' and C-C' of FIG. 4, respectively, showing the step of removing a portion of the dielectric isolations according to one embodiment of the present invention. As shown in the figures, a portion of the dielectric isolations 106 is removed from the structure formed in the steps as described above, and the height of a top surface of the remaining dielectric isolations 106 is lower than the height of a top surface of the first conductive layer (such as the conductive layer 112). That is, after a portion of the dielectric isolations 106 is removed, an opening is formed between the first conductive layers (i.e. the conformal conductive layer 110) above the substrate 100 to define a location where the control gate conductor is to be coupled with the floating gate conductor. Thus, by adjusting the size of the removed dielectric isolations 106, the coupling area of the control gate conductor and the floating gate conductor can be adjusted depending on the design to increase the coupling ratio.

FIGS. 5, 5A, 5B and 5C illustrate a top view and cross-sectional views taken along lines A-A', B-B' and C-C' of FIG.

5, respectively, showing the step of forming the control gate conductor according to one embodiment of the present invention. As shown in the figures, a conformal layer is formed over the substrate 100 to be a coupling dielectric layer between the first conductive layer (the floating gate conductor (110 and 112)) and the second conductive layer 120 (the control gate conductor). The conformal layer can be a dielectric layer having a single layer or multi-layer structure. For example, in this embodiment, the step of forming the conformal layer includes forming a three-layer structure having an oxide-nitride-oxide (ONO) structure. In an exemplary embodiment, a first oxide layer 114 is conformally deposited on the exposed first conductive layer (i.e. the conformal conductive layer 110 and the conductive layer 112 after the planarizing process) above the substrate 100 and the exposed dielectric isolations 106. Then, a conformal nitride layer 116 is formed on the first oxide layer 114, and a second oxide layer 118 is subsequently formed on the conformal nitride layer 116, so that a conformal layer having an oxide-nitride-oxide (ONO) structure is obtained. Furthermore, a second conductive layer 120 is formed over the conformal layer. For example, a conductive layer (e.g. a polysilicon layer) is blanket-deposited over the conformal layer (e.g. an ONO structure).

Figure 6:
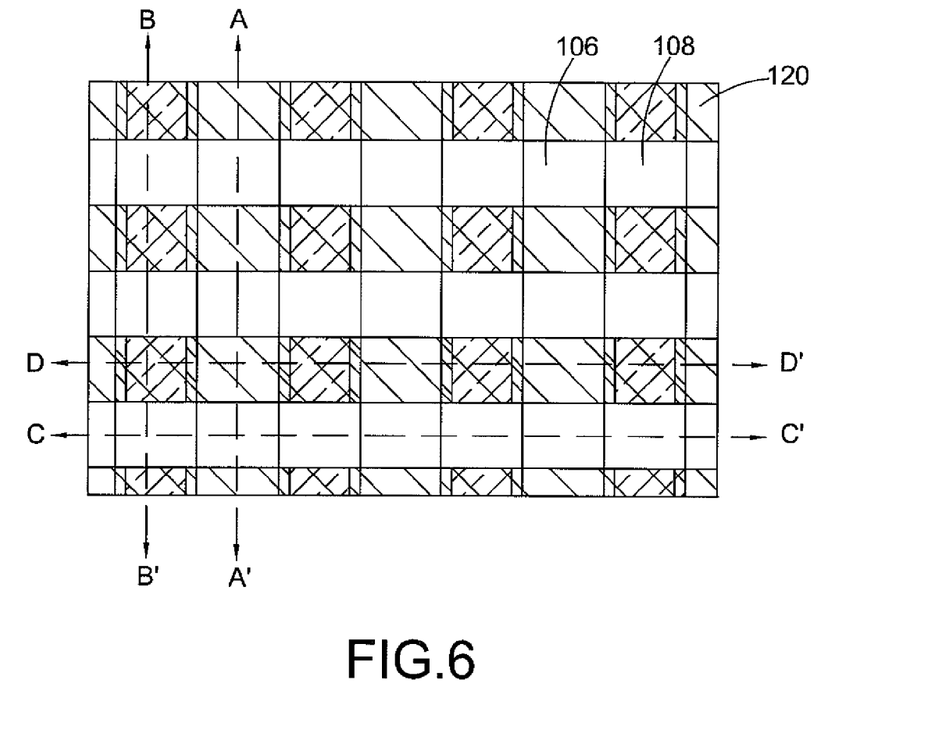
FIGS. 6, 6A, 6B, 6C and 6D are a top view and cross-sectional views taken along lines A-A', B-B', C-C' and D-D' of FIG. 6, respectively, showing the step of defining the control gate conductor in the process of forming a semiconductor structure according to one embodiment of the present invention.
Figure 6A:
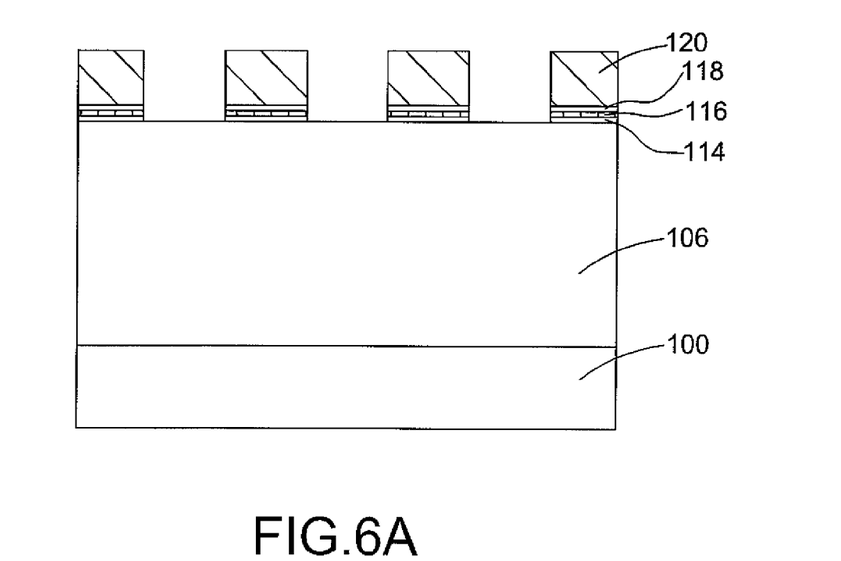
Figure 6B:
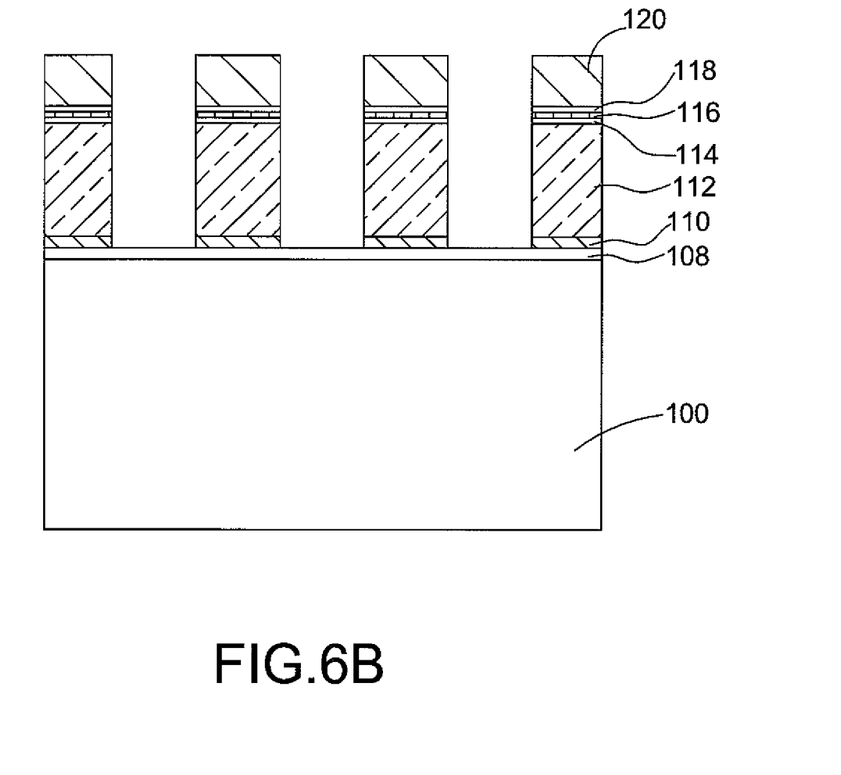
Figure 6C:
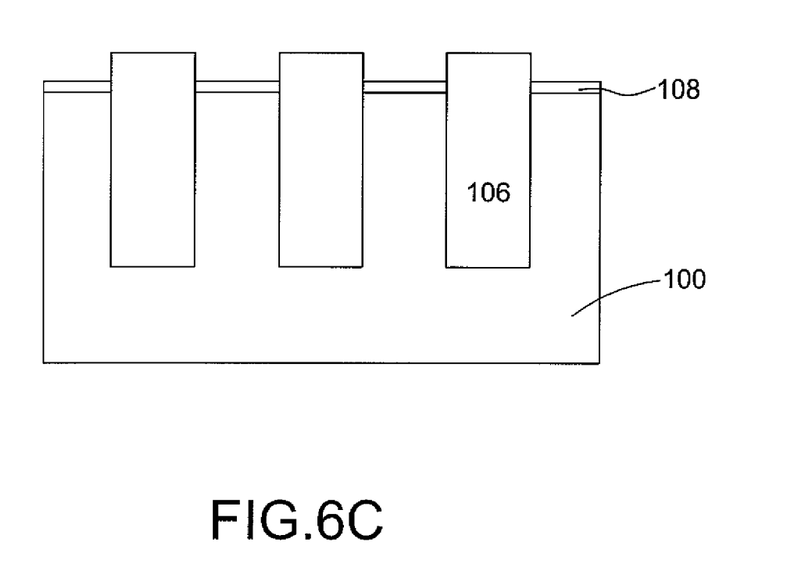
Figure 6D:
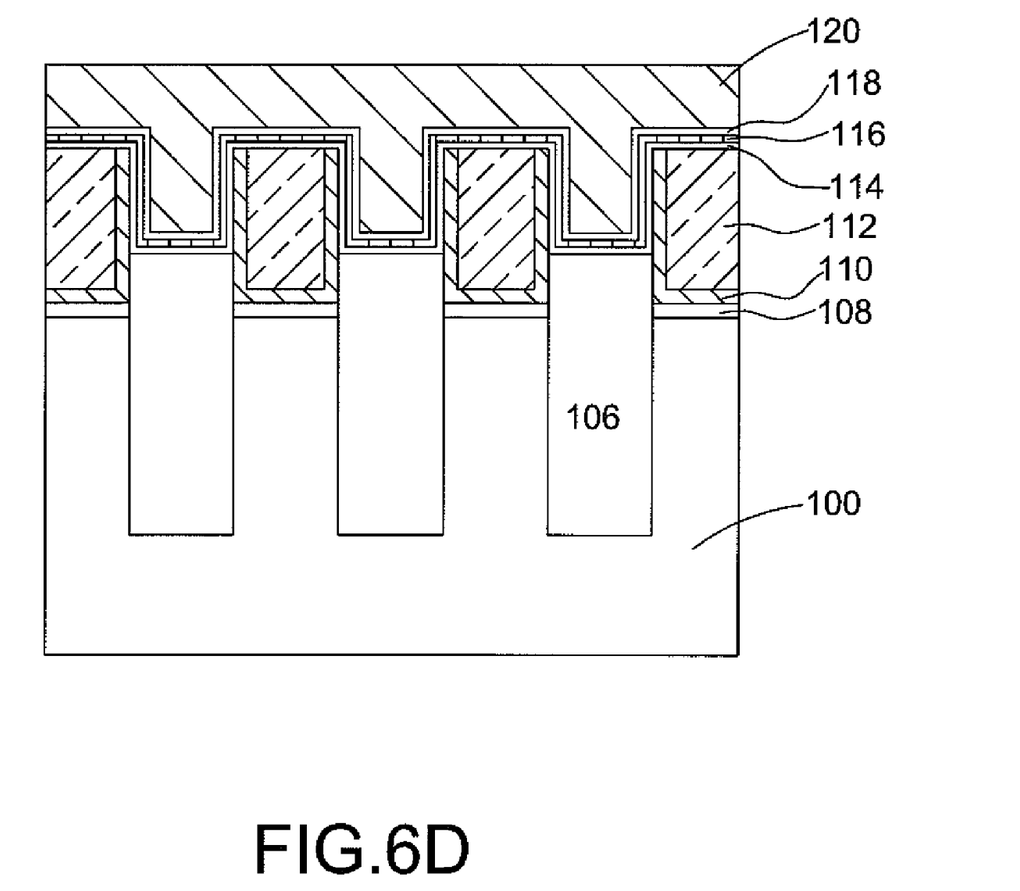

FIGS. 6, 6A, 6B, 6C and 6D are a top view and cross-sectional views taken along lines A-A', B-B', C-C' and D-D' of FIG. 6, respectively, showing the step of defining the control gate conductor according to one embodiment of the present invention. A portion of the conductive layer 120, a portion of the conformal layer (114, 116, 118) and a portion of the first conductive layer (110, 112) are removed along a second direction (i.e. line C-C' of the FIG. 6) perpendicular to the first direction (i.e. line A-A' of the FIG. 6), so as to define the second conductive layer 120 functioning as a control gate conductor. As shown in FIG. 6B, in accordance with the present invention, a plurality of the gate structures including the floating gate and the control gate are defined along the line B-B' of the FIG. 6, and the gate contact region and the source/drain contact region are also defined.

From the above descriptions, the present invention integrates the patterning steps of the active area and the gate contact region to define a floating gate with good profile, excellent coupling ratio. That is, the present invention reduces the lithography processes of defining the floating gate by use a self-aligned technique, and accordingly, the present invention has the advantages of reducing cost and processing time and enhancing the performance of the memory device. Furthermore, the method of the present invention further includes the steps of forming source/drain regions, spacers, source/drain contacts, control gate conductor contacts, and the like to complete the formation of the memory device.

Although specific embodiments have been illustrated and described, it will be obvious to those skilled in the art that various modifications may be made without departing from what is intended to be limited solely by the appended claims.

What is claimed is:

1. A method of forming a semiconductor structure, comprising:
   forming a plurality of parallel trenches in a mask layer on a substrate along a first direction;
   filling said parallel trenches with a dielectric material to form said dielectric isolations, wherein said dielectric isolations extend away from a top surface of said substrate;
   planarizing said dielectric isolations, so that said dielectric isolations are flush with said mask layer;
   forming a dielectric layer on exposed portions of said substrate;
   forming a first conductive layer on said dielectric layer;
   partially removing said dielectric isolations to allow said dielectric isolations remained on said substrate to have a height lower than that of a top surface of said first conductive layer;
   forming a conformal layer over said substrate; and
   forming a second conductive layer on said conformal layer.

2. The method of forming a semiconductor structure of claim 1, wherein a mask layer is formed on said substrate to be adjacent to said dielectric isolations and composed of an oxide layer and a nitride layer.

3. The method of forming a semiconductor structure of claim 1, wherein said step of forming said second conductive layer comprises:
   blanket-depositing a conductive layer over said conformal layer; and
   removing a portion of said conductive layer, a portion of said conformal layer and a portion of said first conductive layer along a second direction perpendicular to said first direction.

4. The method of forming a semiconductor structure of claim 1, wherein said step of forming said dielectric layer comprises thermally oxidizing said substrate to form a gate oxide layer.

5. The method of forming a semiconductor structure of claim 3, wherein said step of forming said first conductive layer comprises:
   forming a conformal conductive layer on said substrate;
   forming a conductive layer over said substrate, wherein said conformal conductive layer has a resistivity different from a resistivity of said conductive layer; and
   planarizing said conductive layer to expose said dielectric isolations.

6. The method of forming a semiconductor structure of claim 5, wherein said step of forming said conformal layer comprises:
   forming a first oxide layer on said substrate;
   forming a conformal nitride layer on said first oxide layer; and
   forming a second oxide layer on said conformal nitride layer.

7. A method of forming a semiconductor structure, comprising:
   providing a substrate;
   forming a mask layer on said substrate;
   forming a plurality of parallel trenches in said mask layer and said substrate along a first direction;
   filling said parallel trenches with a dielectric material to form dielectric isolations;
   planarizing said dielectric isolations to expose said mask layer;
   removing said mask layer to expose a portion of said substrate;
   thermally oxidizing said exposed portion of said substrate to form a dielectric layer;
   forming a conformal conductive layer on said dielectric layer and over said substrate;
   forming a conductive layer over said substrate, wherein said conformal conductive layer has a resistivity different from a resistivity of said conductive layer;
   removing a portion of said dielectric isolations, a top surface of said remaining dielectric isolations being lower than a top surface of said conformal conductive layer;

forming a conformal layer over said substrate;

blanket-depositing a control gate conductor over said conformal layer; and removing a portion of said control gate conductor, a portion of said conformal layer and a portion of said conformal conductive layer along a second direction perpendicular to said first direction.

8. The method of forming a semiconductor structure of claim 7, wherein said step of forming said mask layer comprises forming an oxide layer and a nitride layer.

9. The method of forming a semiconductor structure of claim 7, wherein said step of forming said conformal layer comprises:

forming a first oxide layer on said substrate;

forming a conformal nitride layer on said first oxide layer; and forming a second oxide layer on said conformal nitride layer.

* * * * *